US006807731B2

(12) United States Patent
Brandenburg et al.

(10) Patent No.: US 6,807,731 B2
(45) Date of Patent: Oct. 26, 2004

(54) METHOD FOR FORMING AN ELECTRONIC ASSEMBLY

(75) Inventors: Scott D. Brandenburg, Kokomo, IN (US); Bruce A. Myers, Kokomo, IN (US); Jeenhuei S. Tsai, Carmel, IN (US); Suresh K. Chengalva, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 181 days.

(21) Appl. No.: 10/114,658

(22) Filed: Apr. 2, 2002

(65) Prior Publication Data

US 2003/0184976 A1 Oct. 2, 2003

(51) Int. Cl.[7] .................................................. H05K 3/30
(52) U.S. Cl. .............................. 29/841; 29/825; 29/832; 29/840; 264/272.15
(58) Field of Search .......................... 29/825, 832, 840, 29/841; 264/272.12, 272.15, 272.16, 272.17

(56) References Cited

U.S. PATENT DOCUMENTS

| 4,947,235 | A | | 8/1990 | Roth et al. | |
|---|---|---|---|---|---|
| 5,148,350 | A | * | 9/1992 | Chan et al. | 361/721 |
| 5,570,272 | A | * | 10/1996 | Variot | 361/723 |
| 5,872,332 | A | | 2/1999 | Verma | |
| 6,003,586 | A | * | 12/1999 | Beane | 164/63 |
| 6,180,045 | B1 | * | 1/2001 | Brandenburg et al. | 264/263 |
| 6,285,551 | B1 | * | 9/2001 | Brandenburg et al. | 361/704 |
| 6,304,450 | B1 | * | 10/2001 | Dibene et al. | 361/704 |
| 6,432,742 | B1 | * | 8/2002 | Guan et al. | 438/106 |
| 6,549,426 | B1 | | 4/2003 | Lawlyes et al. | |

* cited by examiner

Primary Examiner—Carl J. Arbes
(74) Attorney, Agent, or Firm—Stefan V. Chmielewski

(57) ABSTRACT

An overmolded electronic assembly having an electromagnetic interference shield, in the form of a thin metal film or foil, coupled to the top of or within an overmolded body. The shield effectively reduces the amount of electromagnetic interference ("EMI") emissions from penetrating within the assembly to the circuit board without substantially increasing the cost of the unit. Thus, an electronic assembly having improved vibration, moisture, and EMI emission resistance is achieved as compared with traditional overmolded or metal assemblies. Further, because the shield can be formed on the electronic assembly in one continuous processing step, a substantial savings in time and cost for the manufacturing process is also realized.

14 Claims, 5 Drawing Sheets

METHOD FOR FORMING AN ELECTRONIC ASSEMBLY

TECHNICAL FIELD

The present invention relates generally to electronic systems and more particularly to an electromagnetic interference shield for overmolded packaging of an electronic assembly.

BACKGROUND OF THE INVENTION

Circuit boards with semiconductor devices such as flip chips must often be protected from the environment in which the board is employed. A widely practiced method is to enclose such circuit boards in an assembly that includes a pair of case halves that must be assembled together by hand to form an enclosure that supports the circuit board within. Connectors secured to one of the case halves provide for electrical interconnection to the circuit board. Sealing elements are also typically required to exclude moisture from the enclosure. Finally, fasteners are required to secure the assembly together. Such assembly processes are labor intensive, and the resulting package must be tested for leakage to ensure the package was properly assembled.

To simplify the design, an overmolded electronic assembly that is compatible with automated assembly methods has been used. The overmolded assembly, typically comprised of plastic or epoxy type material, includes a heat conductive member, such as a heat sinking backplate, in thermal contact with one or more of the circuit devices mounted to the circuit board. The overmolded body encloses the circuit board and the circuit device with the heat conductive member, such that the overmolded body and heat-conductive member form a moisture-impermeable seal around the circuit board and circuit device. The overmolded body has a connector housing integrally formed in its outer surface. The overmolded body is non-metallic and is typically formed of a plastic or epoxy-type material and provides a secure environment against vibration and shock. One example of an overmolded electronic assembly is described in U.S. Pat. No. 6,180,045 to Brandenburg et al., which is herein incorporated by reference.

One problem with overmolded electronic assemblies is that the non-metallic topside of the assembly cannot shield electromagnetic interference ("EMI") emissions as can typical sheet metal or die cast metallic housings.

From the above, it can be appreciated that an electronic assembly that combines the simplified processing and improved moisture and vibration resistance of an overmolded body assembly with improved EMI emissions resistance would be highly desirous.

SUMMARY OF THE INVENTION

According to the present invention, there is provided an overmolded electronic assembly having a thin metal shield, in the form of a film or foil, coupled to a top portion of the overmolded module. The thin metal shield effectively reduces the amount of EMI emissions from penetrating within the assembly to the circuit board without substantially increasing the cost of the unit. It also prevents EMI radiated emissions generated inside the assembly from escaping outside of the enclosure. Thus, an electronic assembly having improved vibration, moisture, and EMI emission and radiation resistance is achieved as compared with traditional overmolded or metal assemblies. Further, because the metal shield can be formed on the electronic assembly in one process step, a substantial savings in time and cost for the manufacturing process can be realized.

The method for manufacturing the electronic assembly can be performed in three distinct ways. In one method, the metal shield is preformed as a film to a desired shape and placed in a mold cavity just prior to molding. A vacuum holds the metal film preform in place during the molding process. The metal film is then adhered to a top surface of the overmolded body of the overmolded electronic assembly. In another method, the roll of metal foil is incorporated into a film assisted molding equipment ("FAME") mold press. A modified FAME process is used to incorporate the metal film within the overmolded body of the overmolded electronic assembly. In a third method, the overmolded assembly is first formed and then a thermal or kinetic spray coating of metal film is applied to the outside of the overmolded assembly.

Other objects and advantages of the present invention will become apparent upon considering the following detailed description and appended claims, and upon reference to the accompanying drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
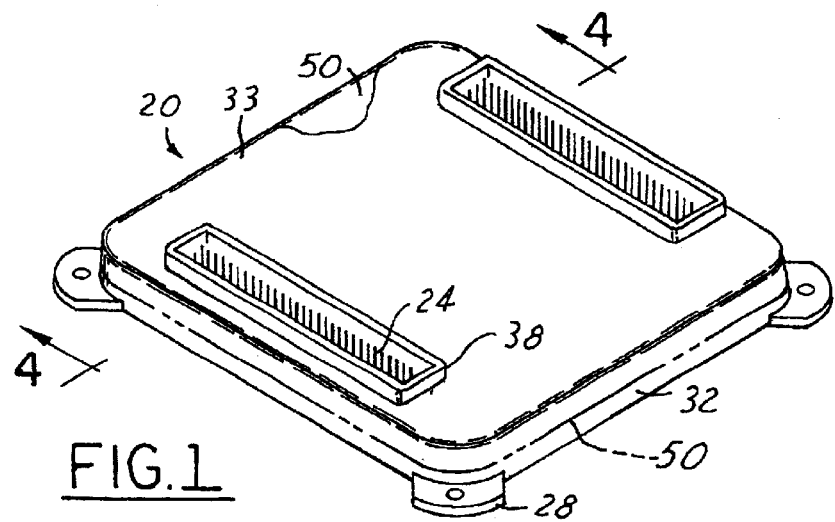
FIG. 1 shows an overmolded electronic assembly having a thin metal EMI shield according to a first embodiment of the present invention.
Figure 2:
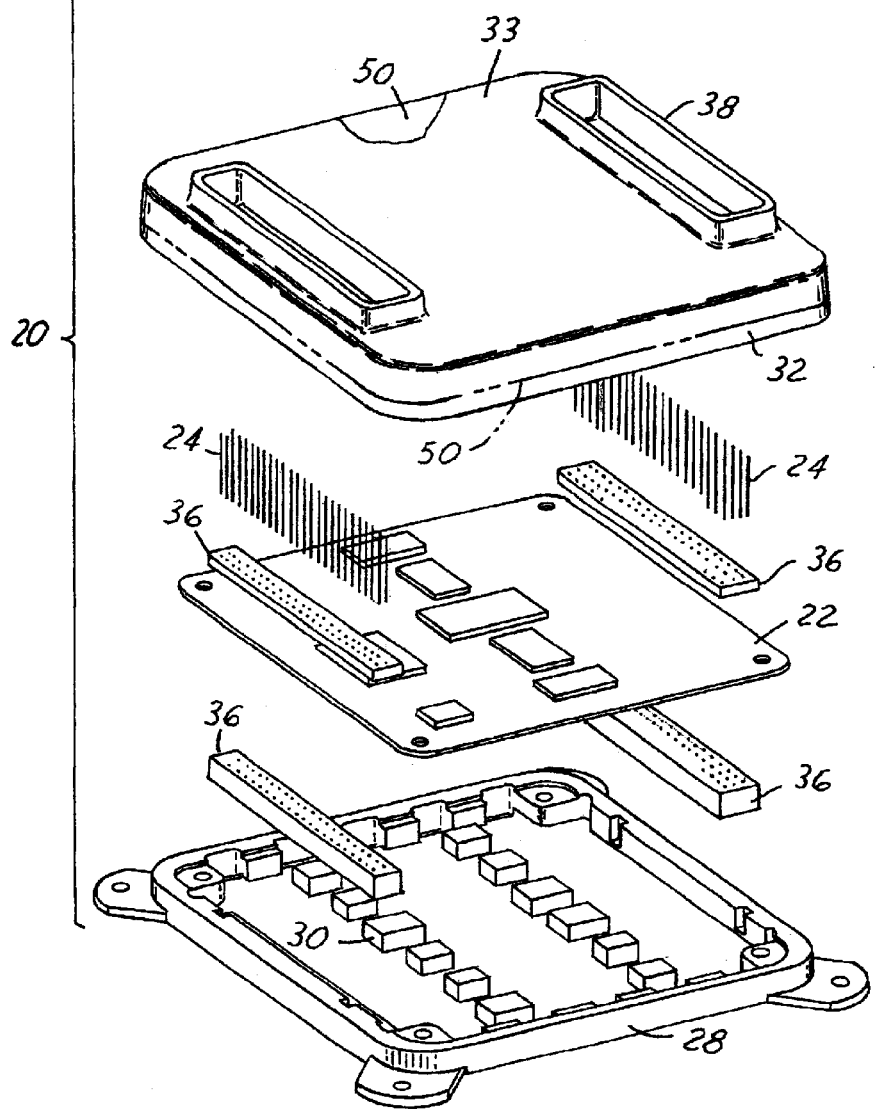
FIG. 2 is an exploded view of FIG. 1.
Figure 4:
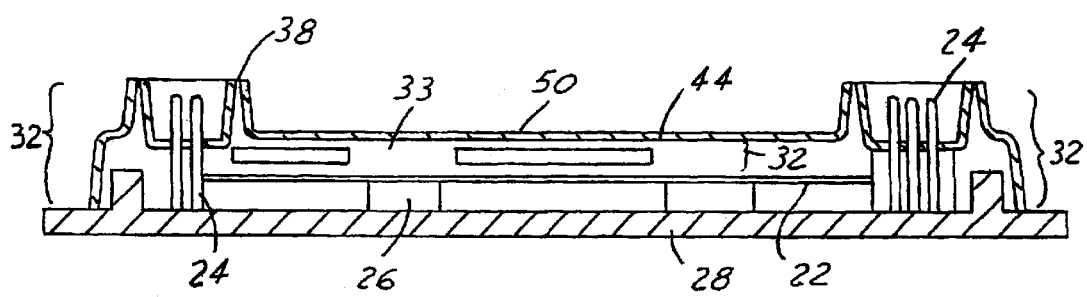
FIG. 4 is a cross-sectional view of FIG. 1 taken along line 4—4.

FIGS. 1, 2 and 4 show an overmolded electronic assembly 20 enclosing a circuit board 22 in accordance with a preferred embodiment of the present invention. The circuit board 22 may be laminate printed wiring board (PWB), or any other material known in the art. Shown mounted to one surface of the circuit board 22 in FIG. 4 are several integrated circuit packages, or IC packages 26, that dissipate heat. The packages 26 will typically be flip chips, though the invention is applicable to essentially any surface-mount through hole mounted device. The circuit board 22 has a pin retainer 36 includes I/O (input/output) connector pins 24 electrically interconnected with the circuit board 22 in any suitable manner. In addition to the circuit board 22, the assembly 20 includes a heatsink 28 formed of a conductive material, such as metal or a metal-filled plastic. The heatsink 28 has a number of pedestals 30 in thermal contact with the IC packages 26 such that the heat is conducted from the packages 26 and into the heatsink 28 for subsequent dissipation to the surrounding environment.

An overmolded housing assembly 32 encases the circuit board 22, contacting the upper surface of the circuit board 22 (opposite the IC packages 26) and underfilling the circuit board 22, and therefore contacting the heatsink 28 and the lower surface of the board 22. In this manner, the overmolded housing assembly 32 forms a moisture-impermeable seal around the circuit board 22 and its IC packages 26, as best seen in FIG. 4. The overmolded housing assembly 32 includes a pair of integrally formed connector housings 38 into which the pins 24 project, such that the pins 24 and connector housings 38 form a pair of connectors on the exterior of the electronic assembly 20.

As best shown in FIG. 4, an EMI shield 50 is coupled to a top portion 44 of an overmolded body 33 to form the overmolded housing assembly 32. The EMI shield 50 functions to absorb and block electromagnetic interference ("EMI") energy that may be emitted by or absorbed by the circuit board 22. The EMI shield 50 may consist of any conductive material. Preferably, as shown in FIG. 4, the EMI shield 50 comprises a thin metal film such as an aluminum foil film. In another preferred embodiment, the shield 50 comprises a spray coating of either tin, zinc, a mixture of tin and antimony, or a mixture of silicon and bronze.

Figure 5:
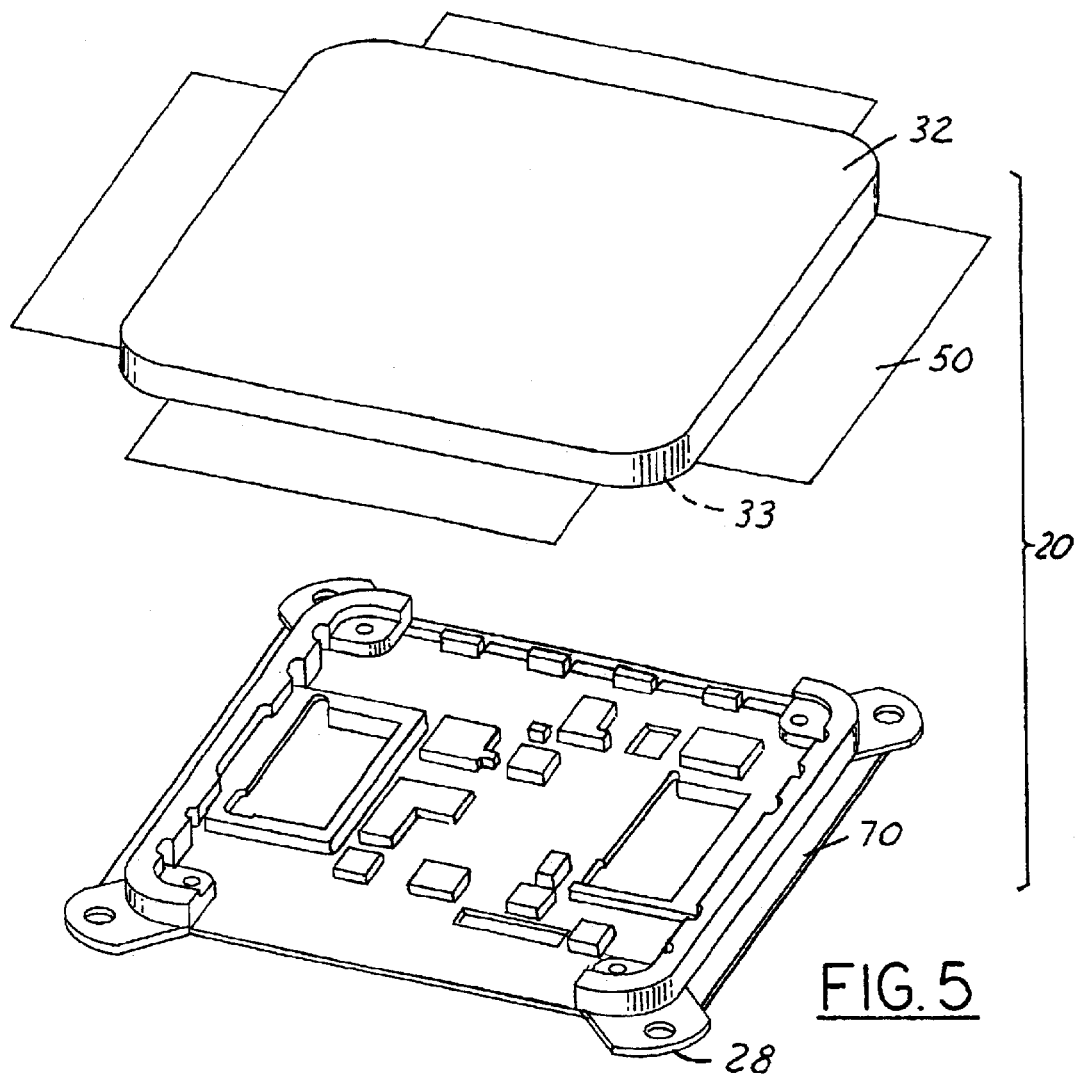
FIG. 5 illustrates a preferred thin metal film arrangement for the embodiment of FIG. 1.

Referring to FIG. 5, the EMI shield 50 preferably extends over the entire top portion 44 of the overmolded body 33 and is irreversibly or reversibly attached to a rail portion 70 of the heatsink 28. This allows the EMI shield 50 to be grounded to the heatsink 28, which provides additional electromagnetic interference shielding compared to non-grounded versions. To irreversibly attach, the EMI shield 50 is secured to the rail portion 70 by using an adhesive or by welding. To reversibly attach, a mechanical interlocking feature (not shown) could be added to the rail portion 70 that is capable of reversibly coupling the EMI shield 50 to the heatsink 28.

Two methods for making the overmolded housing assembly 32 having the EMI shield 50 coupled to the top surface 44 of the overmolded body 33 or coupled within the overmolded body 33 near the top surface 44 are described below in FIGS. 6–13 and FIG. 14 respectively below. A method for making the overmolded housing assembly having a sprayed thermal metal EMI shield 50 is shown in FIG. 15 below.

Figure 3:
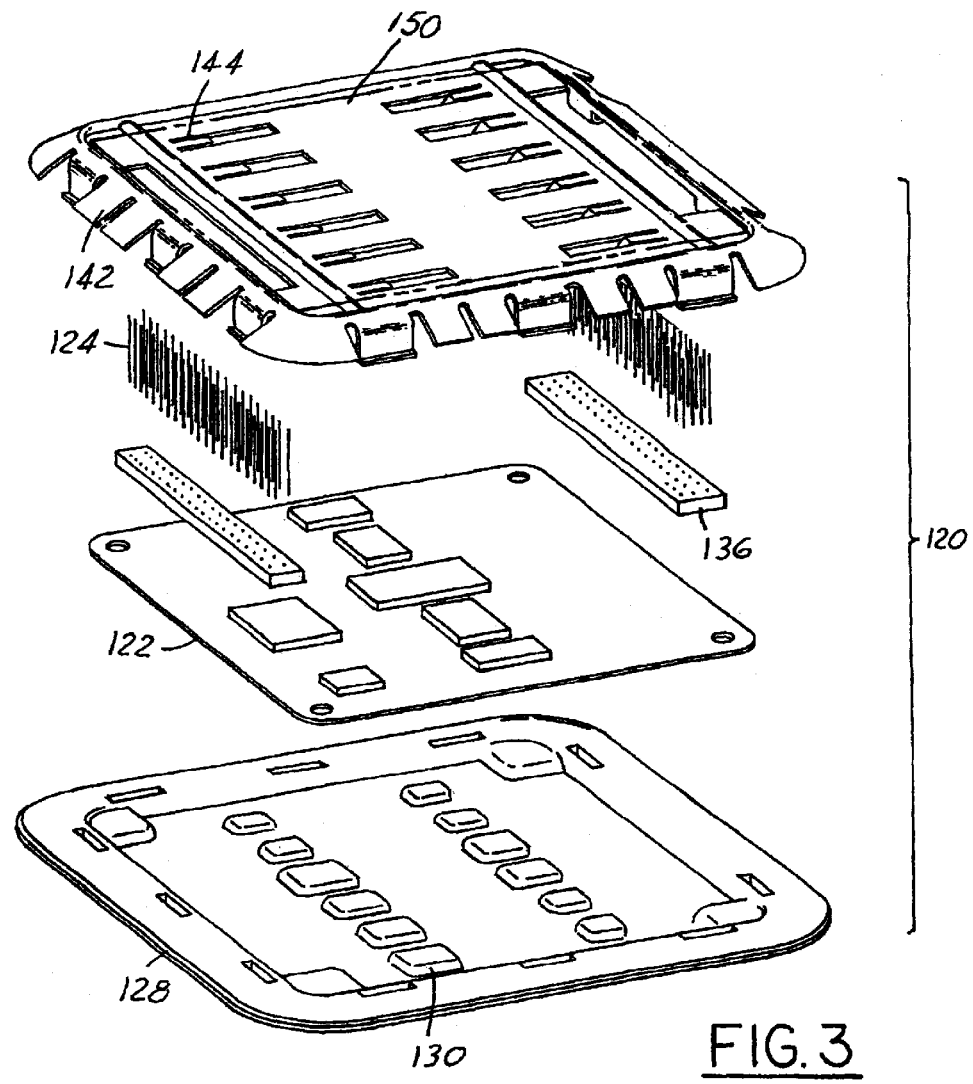
FIG. 3 shows and exploded view of an insert molded metal EMI shield prior to overmolding according to a second embodiment of the present invention.

In a second embodiment, as shown in FIG. 3, an electronic assembly 120 having the thin EMI shield 150 formed as a thin metal stamping. The EMI shield 150 includes integrally-formed locking appendages 142 that interlock with the heatsink 128, and biasing members 144 that apply pressure to the near surface of the circuit board 122 to promote thermal contact between the IC packages and the pedestals 130 on the heatsink 128. The assembly 120 includes a circuit board 122 with connector pins 124, IC packages (not shown) and pin retainers 136, a heatsink 128 with pedestals 130. The locking appendages 142 and biasing members 144 can be any suitable elements, such as the resilient cantilevered springs shown in FIG. 3. However, it is foreseeable that other elements could be used for these purposes, such as elastomeric pads on the lower surface of EMI shield 150 to contact the circuit board 122. While not shown, the EMI shield 150, after attachment to the heatsink 128, is subsequently overmolded in a manner similar to FIGS. 1, 2 and 4 to form an overmolded electronic assembly having the EMI shield 150.

Figure 6:
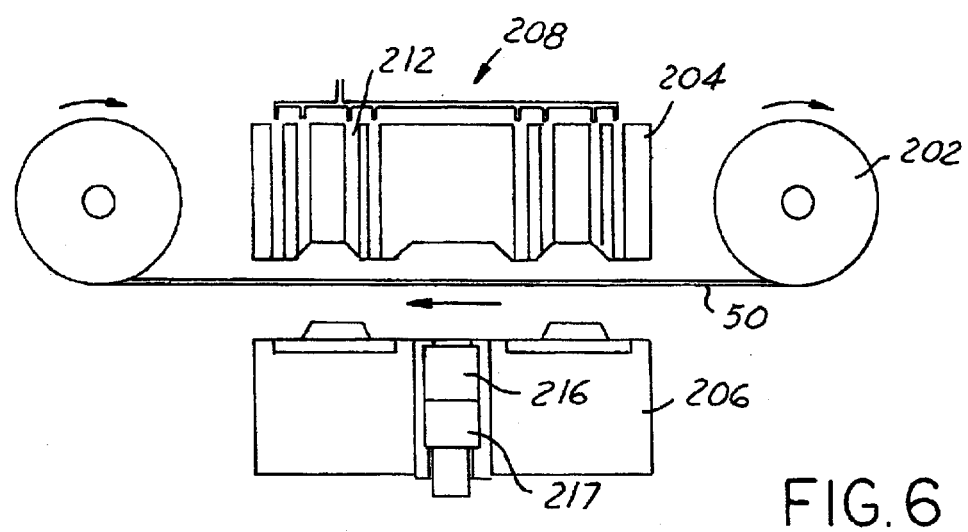
FIGS. 6–13 illustrates one preferred method of making the overmolded housing having a thin metal EMI shield as shown in FIG. 3.
Figure 7:
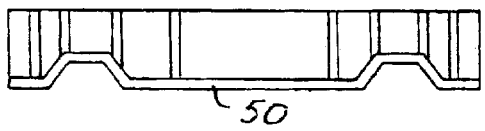
Figure 8:
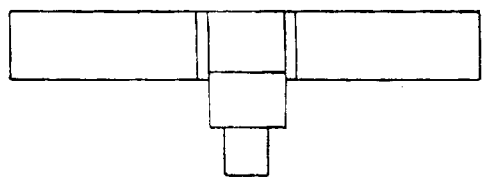

Referring now to FIGS. 6 through 13, one method of making the overmolded housing assemblies 20 having the EMI shield 50 located along a top surface 44 of the overmolded body 33 is depicted. First, as shown in FIG. 6, the EMI shield 50, in the form of a thin metal foil, is unrolled from a creel 202 and feathered through a top chase 204 and a bottom chase 206 of a film assisted molding equipment, or FAME mold 208. Next, as shown in FIG. 7, a vacuum is introduced through the vacuum slots 212 of the top chase 204 that pulls the EMI shield 50 through suction to a cavity face 214 contained on the bottom surface of the top chase 204. In FIG. 8, the heatsink 28 and the rest of the components of the assembly 20 are set to the bottom chase 206. This may be accomplished using an automated system or manually.

Figure 9:
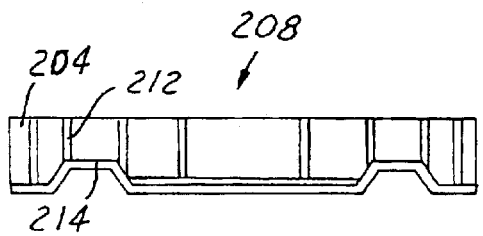
Figure 10:
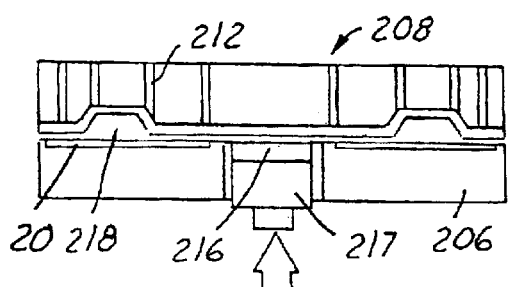
Figure 11:
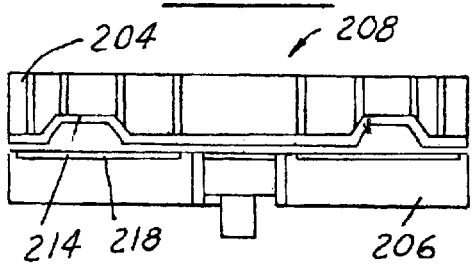

Next, in FIG. 9, the bottom chase 206 is clamped to the top chase 204 at a press tonnage of approximately 80 tons. In FIG. 10, a resinous material 216 in the form of a mini tablet is forced upward by a plunger 217 under pressure of into the cavity 218 defined between the bottom chase 206 and EMI shield 50. As shown in FIG. 11, the resinous 216 material is cured to the EMI shield 50 to form the overmolding body 33. As is understood by those of skill in the art, the shape of the cavity 218 dictates the shape of the overmolded body 33. Thus the overmolded body 33 and 133 may be formed in the same manner by simply changing the shape of the cavity 218.

The amount of pressure, curing time and curing temperature of the overmolded body 33 is dependent upon numerous factors, most notably the type of resinous material 216 used. For an epoxy type material used in making the overmolded body 33 similar to those shown in FIGS. 1–4, for example, a pressure of approximately 500 pounds per square inch and a molding temperature maintained at approximately 165 degrees Celsius for about 2 minutes is necessary to form the overmolded body 33.

Figure 12:
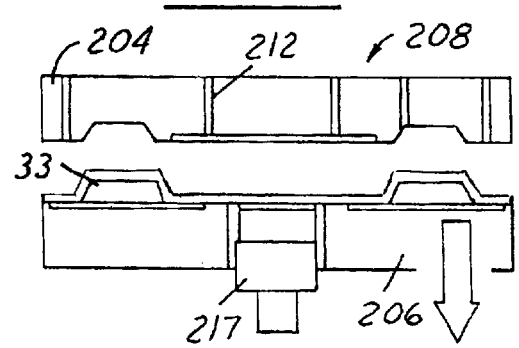
Figure 13:
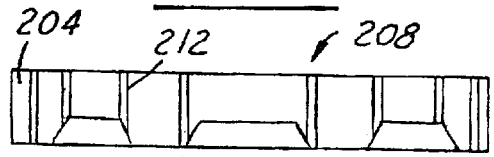

In FIG. 12, the bottom chase 206 is opened and the overmolding housing assembly 32 containing the EMI shield 50 along the top surface 44 of the overmolded body 33 is ejected from the top chase 204 of the FAME mold 28 using ejector pins (not shown). Finally, in FIG. 13, the EMI shield 50 is indexed and the process repeated to form the next overmolded body 33 containing the EMI shield 50. In a preferred embodiment, the process of FIGS. 6–13 for forming the overmolded housing assembly 32 takes approximately two and one-half minutes.

Figure 14:
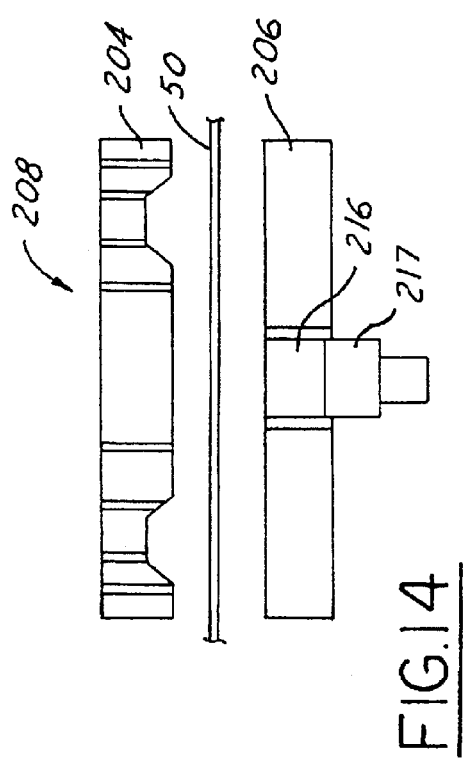
FIG. 14 is a perspective view of another preferred method of making the overmolded housing having a thin metal EMI shield as shown in FIG. 3.
Figure 15:
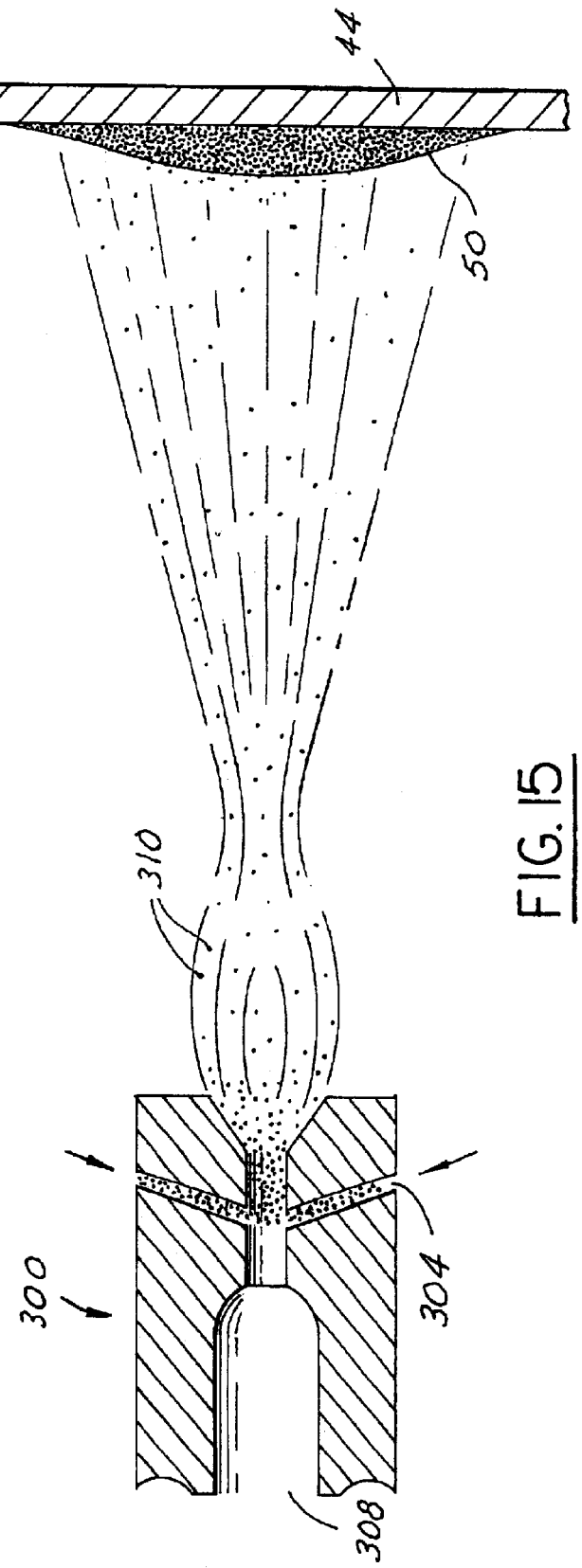
FIG. 15 is a perspective view of another preferred method for making the overmolded housing of FIG. 1.

FIG. 14 illustrates another preferred process for making the overmolded housing assemblies 32 of FIGS. 1, 2 and 4. The method similar to that of FIGS. 6–13, however the vacuum forming of FIG. 7 is replaced by FIG. 14, in which the preformed EMI shield 50 is inserted into the mold cavity 218 of a FAME mold 208 and held stationary using vacuum assist. The resinous material 216 is then injected into the cavity 218 to surround the EMI shield 50. The resinous material 216 is then cured under similar molding conditions to those shown in FIG. 10 above, thereby forming an overmolded body 33 having the EMI shield 50 surrounded by the resinous component 216, as compared with on a top surface 44 of the overmolded body 33 as in the embodiments of FIGS. 1–4.

In another preferred process for making the overmolded assembly 32, the overmolded body 33 is first made without an EMI coating by the method discussed in U.S. Pat. No. 6,180,045 to Brandenburg et al., which is herein incorporated by reference. The EMI shield is added as a EMI shield 50 to the top surface 44 of the overmolded body 33 by a spray process to form the overmolded assembly 32. This is shown in FIG. 15.

Referring now to FIG. 15, the metal EMI shield 50 is applied as a spray from a spray gun to the top surface 44 of the overmolded body 32 to form the overmolded housing assembly 33. The spray gun can be a thermal spray gun, shown as 300 in FIG. 15, or a kinetic spray gun. Examples of thermal spray guns include a flame sprayer, an electric arc sprayer, a plasma-arc sprayer, or any other type of thermal sprayer that can apply a liquid metal film that is known in the art.

The raw metal material 304 preferably comprises metals such as tin or zinc or alloys such as tin/antimony or silicon/bronze. The raw metal material 304 is fed into the thermal spray gun 300 by conventional methods. The thermal spray gun 300 has a thermal heat source 308 that melts the raw metal material 304. The material 304 is then dispersed from the gun 300 as molten droplets 310 and is applied to the top surface 44 of the overmolded body 33 to form a thin coating. The thin coating cools and dries to the top surface 44 to form the EMI shield 50. The EMI shield 50 thickness is preferably about between 0.002 and 0.004 inches thick, and more preferably about 0.003 inches thick, which is sufficient to obtain adequate EMI protection for the circuit board 22. Typically, the top surface 44 is roughened prior to application of the EMI shield 50 to increase adhesion.

The present invention offers many advantages over previous overmolded and EMI shielding applications. First and foremost, the present invention provides an overmolded packaging for a circuit board that provides a secure environment from moisture, vibration and shock as well as protection from harmful EMI emissions. Because the overmolded body 33 having an EMI shield can be formed in one continuous processing step, substantial savings in terms of time and cost in manufacturing are realized. Also, the EMI shield 50 as shown in FIGS. 1–4 offers an inexpensive method for absorbing and blocking electromagnetic interference energy that may be emitted by or absorbed by the circuit board 22.

While the invention has been described in terms of preferred embodiments, it will be understood, of course, that the invention is not limited thereto since modifications may be made by those skilled in the art, particularly in light of the foregoing teachings.

What is claimed is:

1. A method for forming an overmolded electronic assembly having improved EMI shielding comprising:
    providing a heatsink and a circuit board;
    providing a thin metal film;
    forming an overmolded housing assembly by curing a resinous material to form an overmolded body coupled to said thin metal film;
    coupling said circuit board to said heatsink; and
    coupling said overmolded housing assembly to said heatsink such that said circuit board is sealed within said overmolded body and said heatsink.

2. The method of claim 1, wherein forming an overmolded housing assembly comprises:
    introducing said thin metal film between a top chase and a bottom chase of a film assisted molding equipment mold;
    pulling said thin metal film to a bottom surface of said top chase using vacuum;
    coupling said top chase to said bottom chase;
    introducing said resinous material to a cavity formed between said bottom chase and said thin metal film;
    curing said resinous material to form an overmolded body, wherein said overmolded body and said thin metal film form said overmolded housing assembly; and
    ejecting said overmolded housing assembly from said film assisted molding equipment mold.

3. The method of claim 2, wherein introducing said resinous material and curing said resinous material comprises:
    introducing an epoxy resin to a cavity formed between said bottom chase and said thin metal film; and
    curing said epoxy resin to form an overmolded body, wherein said overmolded body and said thin metal film form said overmolded housing assembly.

4. The method of claim 3, wherein curing said epoxy resin comprises curing said epoxy resin at about 500 pounds per square inch of pressure at approximately 165 degrees Celsius for about 2 minutes.

5. The method of claim 1, wherein forming an overmolded housing assembly comprises:
    introducing said thin metal film between a top chase and a bottom chase of a film assisted molding equipment mold;
    coupling said top chase to said bottom chase;
    introducing said resinous material to a cavity formed between said bottom chase and said top chase such that said resinous material substantially surrounds said thin metal film;
    curing said resinous material to form an overmolded body surrounding said thin metal film, wherein said overmolded body and said thin metal film form said overmolded housing assembly; and
    ejecting said overmolded housing assembly from said film assisted molding equipment mold.

6. The method of claim 5, wherein introducing said resinous material and curing said resinous material comprises:
    introducing an epoxy resin to a cavity formed between said bottom chase and said top chase such that said resinous material substantially surrounds said thin metal film; and
    curing said epoxy resin to form an overmolded body, wherein said overmolded body and said thin metal film form said overmolded housing assembly.

7. A method for forming an overmolded electronic assembly having improved EMI shielding comprising:
    providing a heatsink and a circuit board;
    forming an overmolded body;
    thermal or kinetic spraying of a thin metal film onto said overmolded body; and
    air drying said thin metal film onto said overmolded body to form an overmolded housing assembly, wherein said thin metal film has sufficient thickness to provide electromagnetic interference shielding to said circuit board.

8. The method of claim 7, wherein spraying a thin metal film onto said overmolded body comprises thermal spraying a thin metal film onto said overmolded body, said thin metal film selected from the group consisting of a thin tin film, a thin zinc film, a thin tin and antimony alloy film, and a thin silicon and bronze alloy film.

9. The method of claim 7, wherein thermal spraying a thin metal film onto said overmolded body comprises thermal spraying a thin metal film onto said overmolded body, wherein the thickness of said thin metal film on said overmolded body is approximately 0.002 and 0.004 inches thick.

10. The method of claim 7, further comprising grounding said thin metal film to a railplate of said heatsink.

11. The method of claim 7, wherein spraying a thin metal film onto said overmolded body comprises kinetic spraying a thin metal film onto said overmolded body, said thin metal film selected from the group consisting of a thin tin film, a thin zinc film, a thin tin and antimony alloy film, and a thin silicon and bronze alloy film.

12. The method of claim 1, further comprising grounding said thin metal film to a railplate of said heatsink.

13. The method of claim 1, wherein said resinous material is cured to the bottomside of said thin metal film.

14. The method of claim 1, wherein said resinous material is cured to surround said thin metal film.

* * * * *